US009281816B2

(12) United States Patent
Amirkhany et al.

(10) Patent No.: US 9,281,816 B2
(45) Date of Patent: Mar. 8, 2016

(54) MODULATED ON-DIE TERMINATION

(71) Applicant: Rambus Inc., Sunnyvale, CA (US)

(72) Inventors: Amir Amirkhany, Sunnyvale, CA (US); Farshid Aryanfar, Allen, TX (US); Ravindranath Kollipara, Palo Alto, CA (US); Xingchao (Chuck) Yuan, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/368,772

(22) PCT Filed: Dec. 22, 2012

(86) PCT No.: PCT/US2012/071534
§ 371 (c)(1),
(2) Date: Jun. 25, 2014

(87) PCT Pub. No.: WO2013/115920
PCT Pub. Date: Aug. 8, 2013

(65) Prior Publication Data
US 2014/0347092 A1 Nov. 27, 2014

Related U.S. Application Data

(60) Provisional application No. 61/592,791, filed on Jan. 31, 2012.

(51) Int. Cl.
*H03K 19/00* (2006.01)
*H03K 19/0175* (2006.01)
(Continued)

(52) U.S. Cl.
CPC ........ *H03K 19/0005* (2013.01); *G06F 13/4086* (2013.01); *G11C 29/50008* (2013.01); *H03K 19/017545* (2013.01); *H04L 25/0278* (2013.01)

(58) Field of Classification Search
CPC .................. H03K 19/0005; H03K 19/017545; G06F 13/4022; G06F 13/4068; G06F 13/4234; G06F 13/4086; H04L 25/0278; H04L 25/0298; G11C 29/50008
USPC ...................................... 326/22, 30
See application file for complete search history.

(56) References Cited

U.S. PATENT DOCUMENTS 5,001,728 A * 3/1991 Fu/ Idner ...................... 375/328
6,525,558 B2 2/2003 Kim et al.
(Continued)

OTHER PUBLICATIONS

International Search Report and Written Opinion dated Mar. 8, 2013 in International Application No. PCT/US2012/071534. 11 pages.
(Continued)

*Primary Examiner* — Vibol Tan
(74) *Attorney, Agent, or Firm* — Charles Shemwell

(57) ABSTRACT

Alternating on-die termination impedances are applied within an integrated circuit device to up-convert signal reflections to higher frequencies that are attenuated by the signaling channel as the reflections propagate toward an intended signal receiver. Through this approach, the disruptive effect of reflected signals may be significantly reduced with relatively little overhead within the interconnected integrated circuit devices and little or no change to the printed circuit board or other interconnect medium. Changes to the printed circuit board or other interconnect medium can be made to further increase attenuation over the frequency band of the up-converted reflection and outside of the transmission band of signals of interest.

20 Claims, 5 Drawing Sheets

(51) Int. Cl.
*H04L 25/02* (2006.01)
*G11C 29/50* (2006.01)
*G06F 13/40* (2006.01)

(56) References Cited

U.S. PATENT DOCUMENTS

| | | | | |
|---|---|---|---|---|
| 6,894,529 B1 * | 5/2005 | Chong et al. | ................... | 326/30 |
| 7,439,760 B2 * | 10/2008 | Nguyen | ......................... | 326/30 |
| 7,495,468 B2 * | 2/2009 | You | ................................ | 326/30 |
| 7,663,946 B2 * | 2/2010 | Kim | ............................. | 365/194 |
| 7,675,316 B2 * | 3/2010 | Lim et al. | ....................... | 326/30 |
| 7,816,941 B2 | 10/2010 | Kim et al. | | |
| 7,847,584 B2 * | 12/2010 | Park | ............................... | 326/30 |
| 7,864,183 B1 * | 1/2011 | Lam et al. | .................... | 345/520 |
| 7,940,079 B2 * | 5/2011 | Hsu | ................................. | 326/30 |
| 8,035,412 B2 * | 10/2011 | Choo et al. | ...................... | 326/30 |
| 8,044,679 B2 * | 10/2011 | Kim | ................................ | 326/30 |
| 2007/0247185 A1 | 10/2007 | Oie et al. | | |
| 2009/0237109 A1 * | 9/2009 | Haig et al. | ....................... | 326/30 |
| 2010/0030934 A1 | 2/2010 | Bruennert et al. | | |
| 2010/0244891 A1 * | 9/2010 | Hsu | ................................ | 326/30 |
| 2011/0095783 A1 * | 4/2011 | Ferolito et al. | ................. | 326/30 |
| 2011/0314200 A1 * | 12/2011 | Wilson et al. | ................ | 710/316 |

OTHER PUBLICATIONS

PCT International Preliminary Report on Patentability dated Aug. 14, 2014 (Chapter I) in International Application No. PCT/US2012/071534. 10 pages.

* cited by examiner

Near-Ground Signaling

Pseudo Open-Drain Signaling

MODULATED ON-DIE TERMINATION

CROSS REFERENCE TO RELATED APPLICATIONS

Pursuant to 35 U.S.C. §§365 and 371, this application is a United States National Stage Application that claims priority to International Application No. PCT/US2012/071534 filed Dec. 22, 2012, which claims priority to U.S. Provisional Patent Application No. 61/592,791 filed Jan. 31, 2012. Each of the above-identified patent applications is hereby incorporated by reference in its entirety.

TECHNICAL FIELD

The present disclosure relates to signal termination within integrated circuit components and systems of integrated circuit components.

BACKGROUND

Modern integrated-circuit (IC) devices often employ on-die termination circuitry that enable termination impedances to be dynamically coupled and decoupled from high-speed signaling links according to signal source and destination. Unfortunately, IC input capacitance and other sources of impedance discontinuity continue to produce performance-limiting reflections despite the mitigating effects of on-die termination.

BRIEF DESCRIPTION OF THE DRAWINGS

Various embodiments disclosed herein are illustrated by way of example, and not by way of limitation, in the figures of the accompanying drawings, in which like reference numerals refer to similar elements and in which.

DETAILED DESCRIPTION

Modulated signaling terminations are applied in various embodiments disclosed herein to up-convert signal reflections to higher frequencies that are attenuated by the signaling channel as the reflections propagate toward an intended signal receiver. Through this approach, the disruptive effect of reflection signals may be significantly reduced with relatively little overhead within the interconnected integrated circuit devices and little or no change to the printed circuit board or other interconnect medium. Changes to the printed circuit board or other interconnect medium can be made to further increase attenuation over the frequency band of the up-converted reflection and outside of the transmission band of signals of interest.

Figure 1:
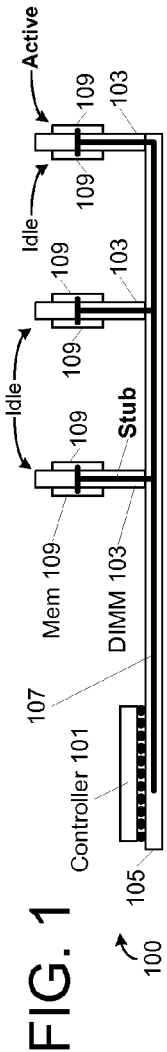
FIG. 1 illustrates an embodiment of a memory system 100 that applies modulated termination to mitigate reflection due to IC input capacitance.

FIG. 1 illustrates an embodiment of a memory system 100 that applies modulated termination to mitigate reflected signals. The memory system includes a control component 101 or "controller" mounted to a printed circuit board 105 and coupled to a number of memory modules 103 via high-speed signaling links 107. The memory modules may be removably inserted into connector slots (or sockets) to enable the memory module population to be increased over time (i.e., from one to two and then three in the example shown), thus providing a path for storage capacity expansion.

In the embodiment shown, each of the memory modules 103 is a dual-inline memory module (i.e., a "DIMM," which may be a small-outline DIMM or SO-DIMM) having a row or other organization of memory devices 109 disposed on each face of the module substrate. Though not specifically shown in the profile view of FIG. 1, the memory devices within each row (or sub-groups thereof) are coupled in common to a respective chip-select and command/address (CA) path, and coupled in parallel to respective sets of data links (any or all of which may be constituents of high-speed signaling links 107). By this arrangement, each individual row or sub-group of memory devices may be selected as a unit or "rank" to receive a memory read or memory write command, with each constituent memory device of the rank receiving memory write data or outputting memory read data in parallel over their respective sets of data links. Through this operation, each rank of memory devices operates, from the perspective of controller 101, as a single logical unit having an N*M-bit wide data interface, where 'N' is the width of the signaling interface within an individual memory device, and 'M' is the number of memory devices within the rank.

Still referring to FIG. 1, each high-speed signaling link 107 extends from the memory controller to a sequence of module sockets (or connectors), branching at each populated socket to form a stub that extends to branched connections to memory devices disposed on one or both surfaces of the memory module 103. Modeling the various segments of the signaling link (i.e., the segment that extends through and/or over printed circuit board 105, the segment that extends through and/or over each memory module substrate, and the segment that extends to a given memory device) as transmission lines each having characteristic impedance $Z_0$ (although the characteristic impedance may differ from segment to segment in other embodiments), it follows that, at each branch, the effective impedance drops to the parallel combination of transmission line impedances and thus to ($Z_0/2$). Accordingly, each inserted memory module 103 causes an additional impedance discontinuity with memory system 100, yielding reflections that shrink signaling margin and limit peak signaling rate. The capacitive inputs of memory devices 109 (i.e., each having an input capacitance Ci) present another source of reflections—often the most dominant in the system—further degrading signaling margins as more memory modules 103 and thus more memory devices 109 are added to the memory system.

In one embodiment, each of memory devices 109 includes on-die termination circuitry that can be programmed to switchably couple different termination impedances to the high-speed signaling links, including fixed terminations, modulated terminations or no termination at all, depending on the source and destination of a given signal. During a memory write operation directed to a selected memory rank, for example, the memory devices of that "active" rank (i.e., one or more memory chips that are intended to receive an incident data signal) may be set to fixed, relatively weak terminations (i.e., relatively high impedance) that provide limited reflection dampening, intentionally allowing a non-negligible reflection, but also a potentially larger signal amplitude at the point of incidence (as well as reduced power consumption). By contrast, stronger (lower impedance) terminations, including modulated terminations as discussed below, may be applied within the constituent memory devices of non-selected, "idle" memory ranks (i.e., one or more memory chips that are neither the source or the intended destination of an incident data signal, also referred to herein as "spectators") to absorb as much of the incident signal energy as possible and thereby limit reflection energy. As signaling rates advance, it may be desirable or necessary to apply stronger terminations, including modulated terminations, within the intended recipient of a data signal (in addition to like terminations within idle ranks of memory components) and thus within the memory chips of an active rank during a memory write operation, and within the control component during a memory read operation.

Despite the application of strong termination within a given memory system component, the input capacitance of the component tends to yield significant signal reflection. In the embodiment of FIG. 1 and embodiments discussed below, modulated termination is applied within idle memory components, and in some cases within active memory components and the controller component, to shift the spectral energy of the reflected signal to higher frequencies where they will be attenuated by the low-pass nature of the signaling channel itself. Modulated on-die termination may also be employed to terminate point-to-point signaling links within a memory system (e.g., terminating one or more links coupled between a control component and a memory component, between a control component and a buffer IC, between a buffer IC and a memory component, etc.) or other within any other system of interconnected integrated circuit devices, for example, to mitigate inter-symbol interference (ISI).

Figure 2:
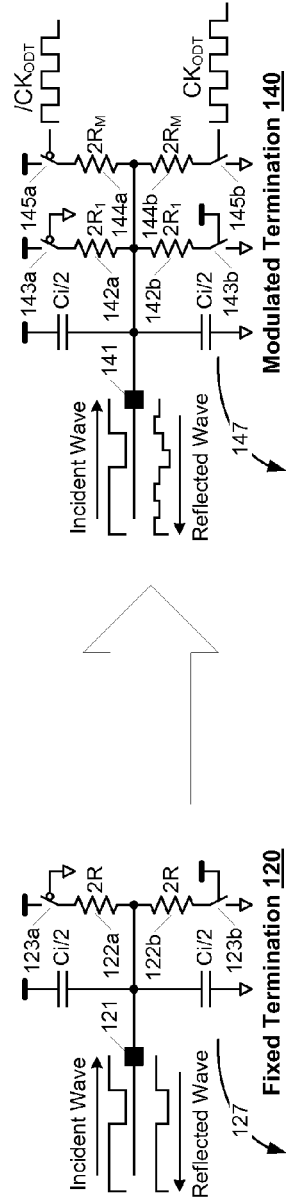
FIG. 2 illustrates an example of the modulated termination approach that may be employed within the memory system of FIG. 1, contrasting the termination circuitry and resulting termination levels to those of a fixed termination FIG. 3 contrasts the different spectral results achieved by the fixed and modulated termination approaches depicted in FIG. 2.

FIG. 2 illustrates an example of the modulated termination approach that may be employed within the memory system of FIG. 1 in the context of a write-data transmission, contrasting the termination circuitry and resulting termination levels to those of a fixed termination. In the fixed termination approach shown at 120, an incident wave arriving at input node 121 of a memory component is absorbed somewhat by the resistive termination network formed by pull-up and pull-down termination elements 122a and 122b, "2R" (each coupled between input node 121 and a respective power supply rail via respective switch elements 123a and 123b during a write data burst interval to effect AC termination impedance, R), but, owing largely to the input capacitance, Ci (modeled as parallel capacitors, "Ci/2", coupled between signal input node 121 and respective power supply rails), nevertheless yields a reflected wave having a spectrum substantially overlapping that of the incident wave. By contrast, when modulated termination is enabled as shown at 140, the termination applied during the write data burst interval is varied (i.e., alternated or cycled) between two different termination impedances having respective impedances greater than and less than the characteristic impedance or matched impedance of the signaling link being terminated to up-convert the spectral energy in the reflected wave to higher frequencies (the matched impedance being, for example, the impedance of a termination that minimizes the magnitude of the reflection coefficient of the link at the termination point at DC frequency). More specifically, fixed pull-up and pull-down termination elements 142a and 142b ("$2R_1$") are coupled between input node 141 and respective power supply rails via switch elements 143a and 143b, respectively, during a write data burst interval, while pull-up and pull-down termination elements 144a and 144b, ("$2R_M$") are alternately coupled to and decoupled from input node 141 during that same interval in response to a termination clock signal (shown, for example, as a differential clock formed by true and complement signals $CK_{ODT}$ and $/CK_{ODT}$ applied to pull-down and pull-up switching elements 145b and 145a, respectively, though other control signals may be used) thereby causing the net termination load to transition at each termination clock edge from $R_1$ to $R_2$ or from $R_2$ to $R_1$, where $R_2$ is the termination impedance resulting from parallel application of $R_1$ and $R_M$ (i.e., $R_2=R_1*R_M/(R_1+R_M)$). As a result, termination impedances $R_1$ and $R_2$ are cyclically coupled to the signal input node (i.e., toggled) in response to oscillation of the termination clock signal between high and low states.

Referring to the exemplary timing waveforms corresponding to the fixed and modulated termination approaches shown respectively at 127 and 147, in both cases a write command ("write") directed to a selected memory device (e.g., within a selected memory rank) is followed a predetermined time later by a corresponding write data burst directed to that memory device. In the example shown, the memory controller raises an ODT signal for the duration of an 8-bit write data burst interval to enable on-die termination within the memory devices attached to the signaling link on which the write data is conveyed, including a soft (or weak) on-die termination within the selected (active) memory device and a stronger termination (i.e., lower impedance) within the non-selected (idle or spectator) memory devices. More specifically, in the fixed-termination approach, the termination impedance, R, (i.e., the equivalent of the simultaneous application of elements 122a and 122b between the input node and respective supply rails) is applied to the signal input of non-selected memory devices while the ODT signal is asserted, while in the modulated-termination approach shown at 147, the applied termination impedance cycles (or toggles) between $R_1$ and $R_2$ at the ODT clock rate during that same interval. In other configurations, both the active and idle memory devices may apply modulated terminations, including uniform modulated terminations (e.g., all memory components terminating the signaling link with a modulated termination that toggles between impedances $R_1$ and $R_2$) or non-uniform impedances (i.e., different termination impedances applied within different signaling links). As explained, the control component may also apply modulated termination during memory read operations. Also, in yet other configurations, the termination impedances applied, whether static or modulated, may vary from component to component (e.g., from one memory rank to another) according to the physical location of the component within the memory system and/or impedance matching considerations. This operation is discussed in further detail below.

Figure 3:
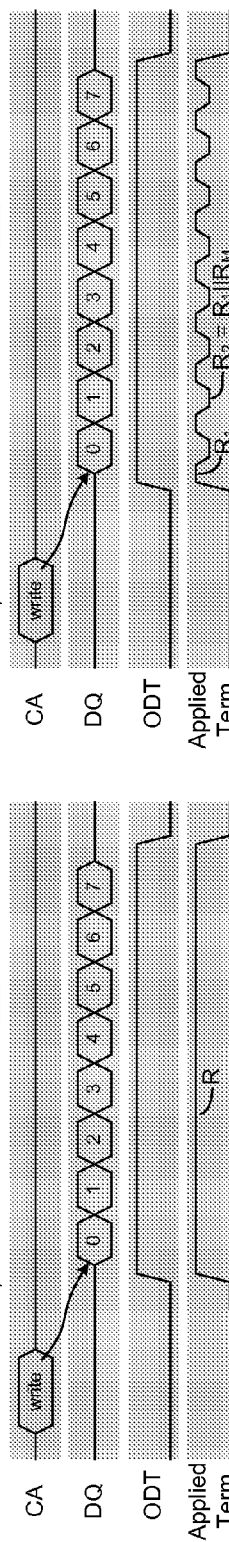

FIG. 3 contrasts the different spectral results achieved by the fixed and modulated termination approaches depicted in FIG. 2. In the example shown, an incident wave corresponding to the signal of interest exhibits spectral energy centered at baseband (negative frequency is not shown) with most of its energy confined to frequencies below the bitrate. The frequency range of the reflected wave spectrum matches that of the incident wave, but at an attenuated level due to absorption within the fixed termination structures. By contrast, when modulated termination is applied, the center frequency of the reflected wave spectrum is up-converted from baseband to the frequency of the ODT clock which, in the example shown, cycles at the data bitrate, thus cycling the termination impedance between R1 and R2 during each unit interval (i.e., time allocated to transmission of a bit or other symbol, or "UI") such that each of the two different terminations is applied for approximately UI/2. This up-conversion establishes a substantial portion of the reflected spectral energy at a frequency beyond the cutoff frequency of the channel (i.e., indicated by the exemplary channel transfer profile "H-Chan") so that the up-converted reflected wave will be substantially attenuated by losses within the signaling channel itself, thereby reducing the net reflected energy arriving at the intended receiver and improving signaling margins. Passive structures and/or active elements may optionally be coupled to the signaling channel (e.g., coupled to signaling lines on a printed circuit board) to increase attenuation beyond the transmission band and thus over the up-converted reflection band.

Mathematically, the effect of the modulated termination can be understood in terms of the reflection coefficient, $\Gamma$, at the signal input/output node (I/O), where F may be expressed as a complex function of the applied termination load ($R_T$), the characteristic impedance of the signaling link ($R_0$), the input capacitance of the I/O node (C), and the angular frequency of the signaling rate ($\omega$)) as follows:

$$\Gamma=(R_T-R_0-jR_0R_TC\omega)/(R_T+R_0+jR_0R_TC\omega) \quad (1)$$

From the foregoing, it can be seen that, at DC (i.e., $\omega=0$), the phase of the reflection coefficient will be zero if $R_T$ is greater than $R_0$ and 180° if $R_T$ is less than $R_0$. At higher frequency, as $C\omega$ becomes dominant, the phase difference between the two cases (i.e., $R_T$ greater than $R_0$ and $R_T$ less than $R_0$) drops below 180°. The high and low values of $R_T$ can be set such that, over the range of transmission frequencies of interest, the phase difference stays above a target level (e.g., above 80°). Further, because the reflected wave is the product of the reflection coefficient and incident wave (i.e., $V^-=\Gamma^*V^+$) it follows that by switching $R_T$ between values greater than and less than $R_0$ (or more generally, switching the termination impedance between first and second impedances that are greater than and less than the characteristic impedance or matched impedance of the signaling link being terminated), the phase of the reflected wave will be modulated, thus imparting high frequency content to the reflection—in effect, up-converting the reflection as in multiplication by a periodic pulse. As explained, this up-conversion establishes the reflected signal at higher frequency, thereby attenuating the reflected signal and reducing its impact.

Figure 4:
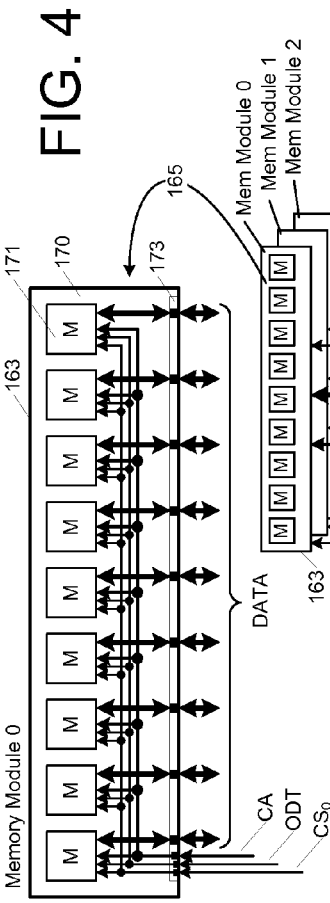
FIG. 4 illustrates conditional terminations that may be applied within a memory system having modulated termination.

FIG. 4 illustrates conditional terminations that may be applied within a memory system 160 having modulated termination. In the example shown, memory system 160 is populated by three memory modules 163 (more or fewer modules may be provided) that are coupled in common to data (DQ), command/address (CA) and on-die-termination (ODT) signal lines, and coupled to receive respective chip-select signals ($CS_0$-$CS_2$). In one embodiment, shown in detail view 165, each memory module 163 includes a substrate 170 having one or more ranks of memory devices 171 disposed thereon. The memory devices 171 within each rank (only one rank is shown in FIG. 4) are coupled in common to incoming control lines, including a chip-select line (CS), on-die termination (ODT) line and command/address lines (CA), and are coupled to respective sets of data lines (DQ) that collectively form the module data interface (i.e., at a connector edge 173 or other contact arrangement). While only one memory rank is shown in FIG. 4 and other embodiments discussed below, two or more memory ranks may alternatively be provided in all such embodiments with, for example, a dedicated chip-select line being supplied to each memory rank to enable its exclusive selection. Also, neither FIG. 4 nor any other system depictions or descriptions herein are intended to limit systems in which modulated termination may be applied to a particular interconnect topology. Rather, modulated terminations may be applied in a broad variety of interconnect topologies including, for example and without limitation, point-to-point interconnect topologies, T-type interconnect topologies (i.e., topologies in which a C/A signaling path branches or "T's" with each branch extending to a respective subset of memory components within a given memory rank), star-type interconnect topologies (i.e., topologies in which respective C/A signaling paths extend to a constellation of memory devices from a control component or other node), fly-by interconnect topologies (i.e., topologies in which C/A signals propagate sequentially past each memory device of a given rank) or any other practicable interconnect topology.

Still referring to FIG. 4, the control component 161 outputs commands and addresses over the command/address lines, asserting one of multiple chip-select lines in association with each such command/address to specify the memory rank to which the command is directed, thus rendering the specified memory rank the "active" memory rank for purposes of the commanded transaction while the remaining memory ranks are "idle." During system-idle intervals (i.e., intervals in which no read or write operations are carried out), control component 161 may deassert an ODT signal on the ODT line to disable termination within the memory devices of all ranks. The control component may also deassert the ODT signal during memory read operations, or may assert the ODT signal to enable modulated termination within idle memory components during read data transmission as shown. Also, as explained, the control component may itself apply modulated on-die termination during the read data transmission.

In the embodiment shown, control component 161 asserts the ODT signal during memory write operations to enable on-die terminations to be applied within the memory devices and more specifically to enable a soft termination ($R_0$) to be applied by the memory components of the active rank while enabling a modulated termination (alternating between $R_1$ and $R_2$) to be applied by the memory components of the idle ranks. In the implementation of FIG. 4, the chip select signals are asserted one-hot, with chip select signal $CS_1$ being asserted while all other chip select signals ($CS_j$) are deasserted to specify the memory devices of memory rank 'i' as active memory components and the memory devices of memory ranks 'j' as the idle memory components. The overall termination scheme is shown in table 167. As explained above, in other embodiments and/or in other configurations, the active rank of memory components may also be enabled to apply a modulated on-die termination, toggling the applied termination between upper and lower impedance values that match those applied in the idle memory ranks, or toggling between other upper and lower impedance values.

Figure 5:
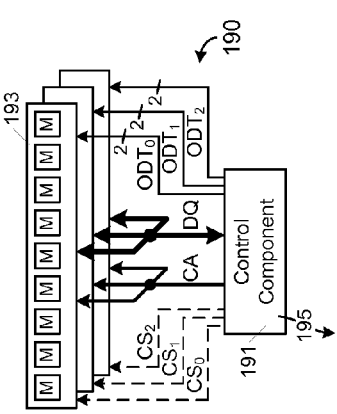
FIG. 5 illustrates an alternative embodiment of a modulated-termination memory system in which multi-bit on-die termination signals are supplied to respective memory modules to specify the termination applied within the memory devices of a given memory rank'

FIG. 5 illustrates an alternative embodiment of a modulated-termination memory system 190 in which multi-bit ODT signals, $ODT_0$-$ODT_2$, are supplied to respective memory modules 193 to specify the termination applied within the memory devices of a given memory rank. Chip select signals are optionally provided as indicated by their dashed signal lines and may be omitted, for example, if an alternative manner of specifying the target memory rank is implemented (e.g., chip ID field included within or otherwise associated with a given memory command to enable exclusive selection of a memory component or rank of memory components). In the embodiment shown, a dedicated two-bit ODT value is provided to each memory rank, with the ODT value being encoded as shown, for example, in table 195 to indicate that on-die termination is to be disabled ($ODT_i[1:0]$ ='00'), set to one of two fixed termination values (e.g., $R_0$ or $R_1$, which may be programmed to establish fixed soft and hard termination impedances, respectively) or set to a modulated termination ($ODTi[1:0]$='11') in which the applied termination is toggled between two different termination impedances during a given write data burst interval.

Figure 6:
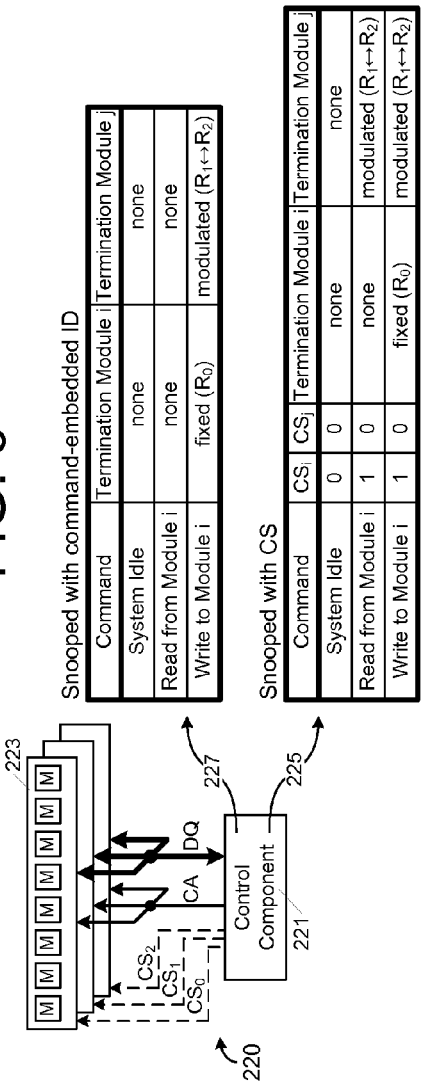
FIG. 6 illustrates another alternative embodiment of a modulated-termination memory system in which commands from a control component are snooped by the memory devices of attached memory modules to determine the transaction state of the memory system and apply fixed, modulated or no termination accordingly.

FIG. 6 illustrates another alternative embodiment of a modulated-termination memory system 220 in which commands from a control component 221 are snooped by the memory devices of attached memory modules 223 (i.e., received and evaluated by each memory device, regardless of whether the memory device is the intended recipient) to determine the transaction state of the memory system and apply fixed, modulated or no termination accordingly. In one such snooped embodiment, the chip-select lines are omitted and chip IDs are embedded within the memory commands themselves to distinguish the active and idle memory devices in a given transaction. Table 225 illustrates an exemplary operation of such a system, with the memory devices within all memory modules disabling termination in the absence of memory access commands (i.e., indicating a system idle condition). By contrast, when a memory write command is detected, the memory devices within active memory module 'i' (or active memory rank if there be more than one per module) apply a fixed soft termination ($R_0$) during the ensuing write data transfer, while the memory components of idle modules 'j' apply modulated termination, alternating between $R_1$ and $R_2$ as shown. When a memory read command is detected, the memory devices within idle modules 'j' may apply a modulated termination as shown. In other configurations, idle memory devices may apply fixed on-die termination during read data transmission, and/or active memory devices may apply modulated on-die termination during write data transmission.

In an embodiment exemplified by table 227, the memory components within the embodiment of FIG. 6 employ command snooping in combination with incoming chip-select signals to establish a termination state. More specifically, the command/address bus is snooped to determine transaction types and the chip-select signals indicate which memory components are active and which are idle during a given memory transaction. In the example shown, the memory components disable termination during system idle and memory read transactions, though idle components may alternatively be configured to apply modulated termination during read data transmission. During memory write transactions (and more specifically, during write data bursts), memory components that receive an asserted chip select signal apply a soft, fixed termination ($R_0$) to enable write data reception, while memory components that receive a deasserted chip select signal (i.e., idle components) apply a modulated termination, alternating between termination loads $R_1$ and $R_2$ during the write data transfer. In other configurations, both active and idle memory components may apply modulated termination.

Within each of the embodiments shown in FIGS. 4, 5 and 6, ranks of memory devices may be selectively enabled to apply modulated or fixed termination (applying programmed termination impedances in either case) according to the physical location of the memory rank within the memory system and/or the memory rank population within the memory system. In one implementation, for example, the memory controller ascertains memory component (or memory rank or memory module) position through information associated with the memory rank (e.g., socket-specific information such that a memory module may be queried to determine the socket in which it is installed, thus enabling the controller to ascertain the quantity and respective socket positions of installed memory modules) and/or through testing (e.g., measuring round trip signaling time or other indication of the distance between a memory rank and the control component). After ascertaining the quantity and respective positions of installed memory modules, the control component may program specific on-die termination impedances to be applied under specified or signaled operating conditions. For example the control component may program idle components to apply modulated termination during write data transmission and/or during read data transmission, and may program active components to apply fixed termination during write data transmission or modulated termination during write data transmission. In addition to selectively enabling and disabling modulated termination (and/or fixed termination) within attached memory components, the control component may selectively enable self-application of modulated termination during read data reception, for example, to reduce ISI. Also, instead of specifying the termination to be applied (or omitted) during a given operation and set of conditions, the control component may select (program) one of a relatively small number of operating profiles within attached memory components, with each operating profile indicating the terminations to be applied (including modulated terminations) in response to a given set of operating conditions, module-location information, and/or control signal states.

Various techniques may be employed to pick specific values of upper and lower termination impedances corresponding to the modulated termination to be applied by a given signaling component (or group of components). In one embodiment, for example, the phase and magnitude of the reflection coefficient may be plotted against frequency for a candidate upper termination impedance (i.e., high value of $R_T$ to be applied in a modulated termination), and then plotted again against frequency for a candidate lower termination impedance (i.e., low value of $R_T$ to be applied in a modulated termination), repeating this operation for respective ranges of candidate upper and lower termination impedance. Thereafter, the final upper and lower termination impedances may be selected such that the difference between the phase of the reflection coefficient in the two cases (i.e., high value of $R_T$ and low value of $R_T$) remains above a specific target phase margin (e.g., 80 degrees, though higher or lower target phase offsets may be applied) over signaling frequencies ranging from DC to the bit-rate frequency. Another consideration (or criterion or condition) in determining the high and low values of $R_T$ is that the difference between the magnitude of the reflection for the two values over signaling frequencies ranging from DC to the bit-rate frequency remains greater than a certain magnitude margin (e.g., 0.2, though higher or lower magnitude margins may be applied).

Still referring to FIGS. 4-6, in cases where memory components from two or more different ranks are disposed in close proximity to one another and coupled to the same signaling link (or set of signaling links), such "parallel" components may be operated as a unit for purposes of signal link termination, with each of the memory components contributing a portion of the overall termination load at any point in time. That is, each of the memory components implements a termination load $M*R_{Termination}$, where M is the number of participating memory components, and $R_{Termination}$ is the collective termination desired. Accordingly, when programmed and/or instructed to apply a modulated termination, each of the participating memory components may modulate its termination (e.g., alternating between $M*R_1$ and $M*R_2$) to effect the target modulated termination. Examples of such physically-proximal, parallel memory components include memory components disposed in a clamshell configuration on opposite faces of a memory module, stacked devices within a multi-die structure (e.g., system in package, package-on-package, three-dimensional IC, etc.) or, both (e.g., where multi-die structures are disposed on both surfaces of a DIMM). Also, collective termination (i.e., multiple chips applying signaling link terminations in parallel to effect a target lumped termination impedance) may be applied in components other than memory devices (e.g., in two buffer ICs disposed on opposite surfaces of a memory module in a clamshell configuration), including proximally disposed integrated circuit devices in signaling systems other than memory systems.

Figure 7C:
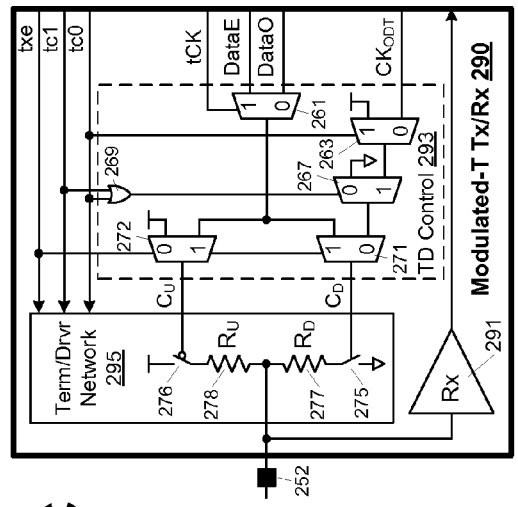
FIGS. 7A-7C illustrate embodiments of signal transceivers having modulated termination circuitry.
Figure 7A:
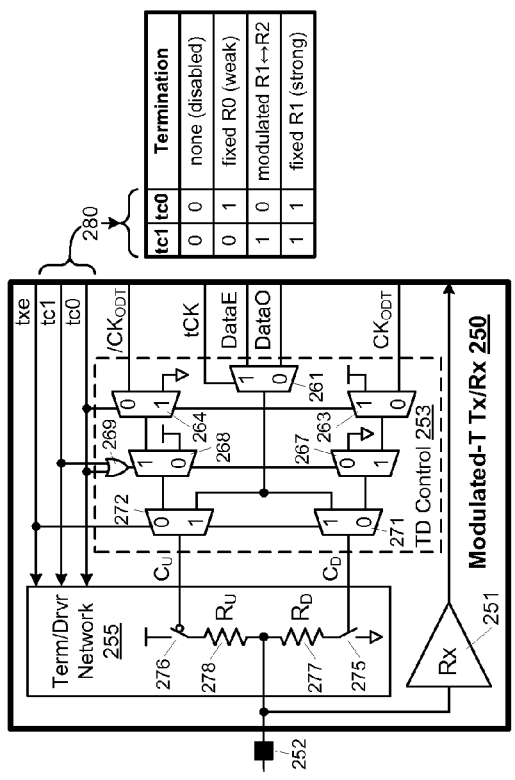

FIG. 7A illustrates an embodiment of a signal transceiver 250 having modulated termination circuitry. As shown, transceiver 250 includes a receiver 251, a termination/driver network 255 and termination/driver control logic 253, and receives control, timing and data signals from upstream logic. More specifically, transceiver 250 is enabled to transmit even and odd data bits (DataE, DataO) via signal I/O node 252 in successive high and low phases of a transmit clock signal, "tck," when a transmit-enable signal, "txe," is asserted. When data transmission is disabled (txe=0), a pair of termination control signals, tc1 and tc0, control the applied termination setting, if any, including a modulated termination that alternates between higher and lower termination loads in successive phases of a differential termination clock signal, $CK_{ODT}$. Though not specifically shown, the transceiver may also receive control values that establish the termination loads (e.g., $R_0$, $R_1$ and $R_2$) to be applied in response to a given state of the termination control and termination clock signals, as well as calibration signals that provide for reference-based adjustment of the specified termination loads.

In one embodiment the termination control signals effect a two-bit code that indicate one of four different termination settings as shown at 280, including disabled termination ('00'), weak, fixed termination ('01') and strong, fixed termination ('11') and modulated termination ('10'). As explained in reference to FIG. 8, the termination control signals and transmit-enable signal are also supplied to termination/driver network 255 to enable selected sets of pull-up and pull-down elements therein to be coupled to signal I/O node 252.

In the exemplary implementation shown, the termination/driver control logic 253 includes multiplexing circuitry that yields data-dependent, steady-state or toggling pull-up and pull-down control signals (i.e., "$C_U$" and "$C_D$," respectively) according to the state of the transmit-enable and termination-control signals. More specifically, when the transmit-enable signal is asserted, multiplexers 271 and 272 select the transmit data bit output from even/odd data multiplexer 261 (i.e., switching alternately between DataE and DataO at each tck transition) to either pull-up or pull-down the signal level at the I/O node in each transmit interval (i.e., each half cycle of tck) and thus effect a data-dependent output state within the transceiver. In the example shown, if the transmit data bit is a logic '1,' both $C_U$ and $C_D$ are driven high, closing switch element 275 (and opening switch element 276) to sink current through the $R_D$ load element 277, thereby pulling down the voltage at I/O node 252 to convey the logic '1' data bit. Conversely, if the transmit data bit is a logic '0,' both $C_U$ and $C_D$ are driven low, closing switch element 276 (and opening switch element 275) to pull up the voltage at I/O node 252 and thus convey the logic '0' data bit. When the transmit-enable signal is deasserted (i.e., logic '0' in this example), the outputs of termination-enable multiplexers 267 and 268 are applied to pull-up and pull-down switching elements 276 and 276 (i.e., as the pull-up and pull-down control signals, $C_U$ and $C_D$) to effect one of the four termination settings shown at 280 according to the states of the termination control signals. That is, if both termination control signals are low ("no termination"), the output of OR gate 269 goes low to select hardwired logic '1' and logic '0' signals (represented by connections to supply and ground rails, respectively, in the example shown) as the pull-up and pull-down control signals, thereby opening switch elements 275 and 276 and effectively decoupling termination loads from I/O node 252. A high state of either termination control signal yields a logic high output of OR gate 269, thus selecting the outputs of termination-control multiplexers 263 and 264 to drive the pull-up and pull-down signals, respectively. As shown, the least significant termination control bit is applied to the control input of termination-control multiplexers 263 and 264 to select either the differential ODT clock ($CK_{ODT}$ and $/CK_{ODT}$) or a steady-state differential enable signal (i.e., '1' and '0') to be forwarded to the termination/driver network as pull-down and pull-up control signals, $C_D$ and $C_U$. Thus, if the termination-control signals are in a '10' state (and the transmit-enable signal is deasserted so that a write data reception operation is enabled within receiver 251), multiplexers 263 and 264 will output the differential ODT clock via multiplexer pairs 267/268 and 271/272 as the pull-down and pull-up control signals, thus effecting a modulated termination within termination/driver network 255. By contrast, if the termination-control signals are in any other non-zero state (i.e., in state '11' or '01'), logic '1' and logic '0' signal states propagate through the multiplexer pairs to produce logic '1' and logic '0' pull-down and pull-up control signals, respectively, and thus effect a fixed termination within termination/driver network 255. As explained in connection with FIG. 8 below, the selection between strong and weak terminations may be effected by application of the termination control signals within the termination/driver network.

Figure 7B:
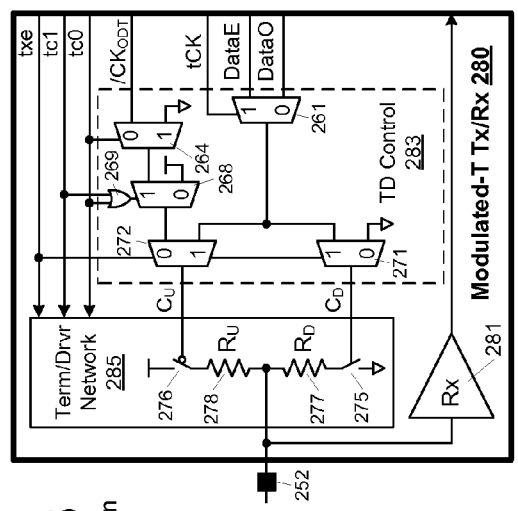

FIG. 7B illustrates another embodiment of a transceiver having a receiver 281, termination/driver network 285 and termination/driver control logic 283 that operate generally as described in reference to FIG. 7A, except that the termination/driver control logic 283 applies pseudo-open drain signaling (PODS) termination and thus omits pull-down termination circuitry. More specifically, when the transmit-enable signal is deasserted, multiplexer 271 outputs a logic-low pull-down control signal, thus opening switching element 275 regardless of the state of the termination control signals. By this operation, weak, strong and modulated terminations are effected only through the pull-up load element 278 ($R_U$) and switching element 276 (i.e., selectively controlled via multiplexers 272, 268 and 264 as discussed above), though I/O node 252 may still be grounded through a relatively high pull-down impedance.

FIG. 7C illustrates another embodiment of a transceiver having a receiver 291, termination/driver network 295 and termination/driver control logic 293 that operate generally as described in reference to FIG. 7A, except that the termination/driver control logic 293 applies near-ground signaling (NGS) termination and thus omits pull-up termination circuitry. More specifically, when the transmit-enable signal is deasserted, multiplexer 272 outputs a logic-high pull-up control signal, thus opening switching element 276 regardless of the state of the termination control signals. By this operation, weak, strong and modulated terminations are effected only through the pull-down load element 277 ($R_D$) and switching element 275 (i.e., selectively controlled via multiplexers 271, 267 and 263 as discussed in reference to FIG. 7A), though I/O node 252 may still be pulled high through a relatively high pull-up impedance.

Reflecting on the termination/driver networks 255, 285 and 295 shown in the embodiments of FIGS. 7A-7C, respectively, it should be noted that pull-up and pull-down load elements 277 and 278 may be formed by a multiplicity of parallel and/or series pull-up and pull-down load elements, and, likewise, that switching elements 275 and 276 may be implemented by a multiplicity of switching elements (e.g., each corresponding to respective load element). By this arrangement, different subsets of pull-down and/or pull-up load elements (including mutually exclusive subsets or subsets that share one or more load elements) may be switchably coupled between I/O node 252 and an upper/lower voltage supply rail to establish respective termination impedances, including the strong and weak fixed termination impedances and the modulated termination impedance discussed above.

Figure 8:
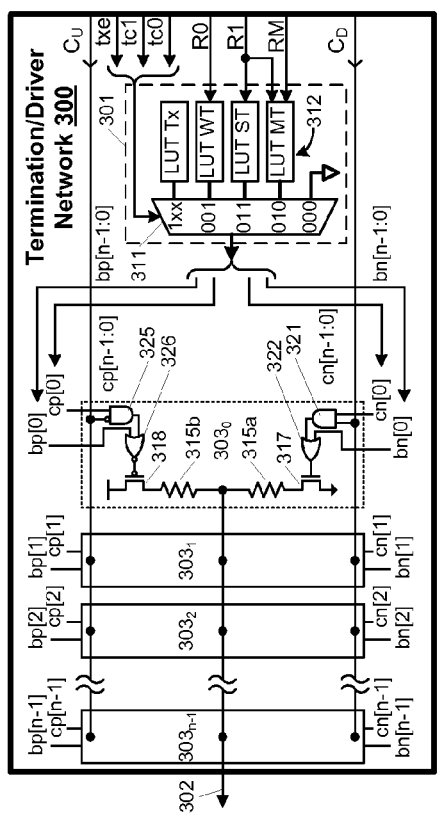
FIG. 8 illustrates an embodiment of a termination/driver network that may be used to implement the termination/driver network shown within the signal transceiver of FIG. 7.

FIG. 8 illustrates an embodiment of a termination/driver network 300 that may be used to implement termination/driver network 255 within the signal transceiver of FIG. 7A. As shown, termination/driver network 300 includes switch control logic 301 and a set of 'n' termination load circuits, $303_0$-$303_{n-1}$. Each of the termination load circuits (collectively, 303) includes a pull-up load element 315b coupled between I/O node 302 and a positive supply rail via switch element 318 (e.g., a P-MOS transistor in the implementation shown), a pull-down load element 315a coupled between I/O node 302 and a ground rail via switch element 317 (e.g., an N-MOS transistor) and a set of logic elements that produce pull-down and pull-up switch signals according to the states of control signals from switch control logic 301. More specifically, logic AND and NOR gates (325 and 326) serve to assert an active-low pull-up switch signal (thereby switchably coupling I/O node 302 to the positive supply rail via pull-up load element 315b) if either (i) base signal bp[0] is asserted, or (ii) active-low pull-up control signal, $C_U$, and active-high control-enable signal, cp[0], are both asserted. In the base pull-up case (i.e., bp[0]=1), pull-up load element 315b remains switchably coupled between I/O node 302 and the supply rail regardless of the state of the pull-up control signal, thus providing a base termination which may be modulated by the logic AND combination (in AND gate 325) of the pull-up control signal and control-enable signal, cp[0]. By contrast, in the controlled-switching case (i.e., bp[0]=0, cp[0]=1), pull-up load element 315b is switchably coupled or decoupled from the supply rail in accordance with the state of the incoming pull-up control signal, thereby enabling modulated termination within an idle memory component during write data transmission and data-dependent output during read data transmission. Logic AND and OR gates (321 and 322) operate similarly to gates 325 and 326 to control pull-down switching element 317. That is, if either (i) base signal bn[0] is asserted, or (ii) active-high pull-down control signal, $C_D$, and active high control-enable signal, cn[0], are both asserted, gates 321 and 322 yield a high output to switchably couple I/O node 302 to the negative (or ground) supply rail via pull-down load element 315a. Again, in the base pull-down case (i.e., bn[0]='1'), pull-down load element 315ba remains switchably coupled between I/O node 302 and the ground rail regardless of the state of the pull-down control signal, thus providing a base termination that may be modulated by the logic AND combination (in AND gate 321) of the pull-down control signal and control-enable signal, cn[0]. By contrast, in the controlled-switching case (i.e., bn[0]=0, cn[0]=1), pull-down load element 315a is switchably coupled or decoupled from the ground rail in accordance with the state of the incoming pull-down control signal, thereby enabling modulated termination within an idle memory component during write data transmission and data-dependent output during read data transmission. When deployed within the exemplary transceiver of FIG. 7, the control-enable signals (cp[n−1:0], cn[n−1:0]) may also be asserted to effect fixed terminations as the pull-up and pull-down control signals are set to supply and ground potentials during fixed-termination intervals.

In one embodiment, termination loads (i.e., pull-up and pull-down elements) within respective termination load circuits are binary weighted with respect to each other such that the conductance of the termination load within termination load circuit $301_{n-1}$ is twice the conductance of the termination load within termination load circuit $301_{n-2}$, four times the conductance of termination load within termination load circuit $301_{n-3}$ and so forth. Different weighting schemes may be employed in other embodiments including, without limitation, uniform weighting within each termination load circuit, thermometer coding, and so forth. Also, instead of providing both a switching element (315a, 315b) and a load element (317, 318) to effect each pull-up or pull-down load, the switching element alone may constitute the pull-up or pull-down load (e.g., transistors 315a and 315b sized to effect desired impedance).

In the embodiment of FIG. 8, switch control logic 301 generates control-enable signals and base signals (i.e., cp[n−1:0]/cn[n−1:0] and bp[n−1:0]/bn[n−1:0], respectively) in accordance with the incoming transmit-enable and termination control signals as well as programmed termination values $R_0$, $R_1$ and $R_M$. In the embodiment shown, the transmit-enable and termination control signals are applied to a lookup table selector 311 to select one of four lookup tables (LUT Tx, LUT WT, LUT ST, LUT MT) corresponding to respective transmit and termination loading configurations or, if the transmit-enable signal is deasserted and both termination control signals are low (i.e., txe/tc1/tc0='000'), to ground the control-enable and base signals and thus decouple all load elements from I/O node 302. If the transmit-enable signal is asserted, a transmit lookup table (LUT Tx) is selected to determine which of the pull-up and pull-down load elements will be applied to the I/O node, thus establishing a transmitter drive strength and conveying the data bit indicated by the pull-up and pull-down control signals. Though no indexing input is specifically shown, the transmit lookup table may output control-enable signals (or even base signals, for example, to compensate for or establish a DC offset) in a pattern corresponding to a calibration value and/or other control information.

The remaining three lookup tables are selected during operations in which the subject memory component is idle or actively receiving data (i.e., when txe is low and the termination control value is nonzero) and include a weak-termination lookup table ("LUT WT"), a strong-termination lookup table ("LUT ST") and a modulated termination lookup table ("LUT MT"). When selected, the weak-termination lookup table outputs control-enable signals (i.e., cp[n−1:0], cn[n−1:0]) in a state corresponding to termination control value, $R_0$, to effect a fixed, soft termination impedance. Strong-termination lookup table similarly outputs control-enable signals in a state corresponding to termination control value, $R_1$, to form a fixed, hard termination impedance (i.e., an optional termination selection as discussed below). When the modulated-termination lookup table is selected, by contrast, the lookup table outputs base signals (bp[n−1:0], bn[n−1:0]) corresponding to base termination value $R_1$, and control-enable signals corresponding to a modulating termination value, $R_M$. By this arrangement, as the pull-up and pull-down control signals cycle (by virtue of the ODT clock selection as discussed in reference to FIG. 7), the applied termination alternates (i.e., is switched) between a base termination impedance corresponding to base termination value $R_1$ and a reduced termination impedance corresponding to the parallel combination of the base and modulating termination values, $R_1$ and $R_M$ and thus between impedance values $R_1$ and $R_2$. Though not shown, calibration signals may be supplied to any or all of the lookup tables to permit collective or independent adjustment of the impedance values produced in response to a given control value (i.e., R0, R1 and/or RM).

It should be noted that the termination/driver network of FIG. 8 and the transceiver of FIG. 7 may be varied in numerous ways. For example, while a push-pull terminator/driver is shown (e.g., as may be used to implement series-stub terminated logic (SSTL) signaling), similar functionality may be implemented within pseudo open drain signaling (PODS) transceivers, near-ground signaling (NGS) transceivers, or any other practicable transceiver implementation. PODS and NGS implementations may be achieved, for example, by omitting pull-down and pull-up termination controls (i.e., simplifying the termination/driver network in accordance with the implementation described in reference to FIGS. 7B and 7C) or by providing additional control signals to establish the signaling mode and thus enable the host transceiver to operate in either an SSTL, PODS or NGS mode (or any other desirable signaling mode) according to a programmed configuration. Further, while the termination load elements shown serve the dual functions of supporting signal transmission in a data transmit mode (or output driver) and effecting a termination during a data reception mode (or while the component is a spectator to a transmission between to other ICs), dedicated termination elements may be provided in alternative embodiments, particularly where no signal transmission function is needed (e.g., to terminate a uni-directional signaling link). While single-ended termination/drive is shown, the circuitry and techniques employed may be readily extended to differential signaling embodiments.

Figure 9:
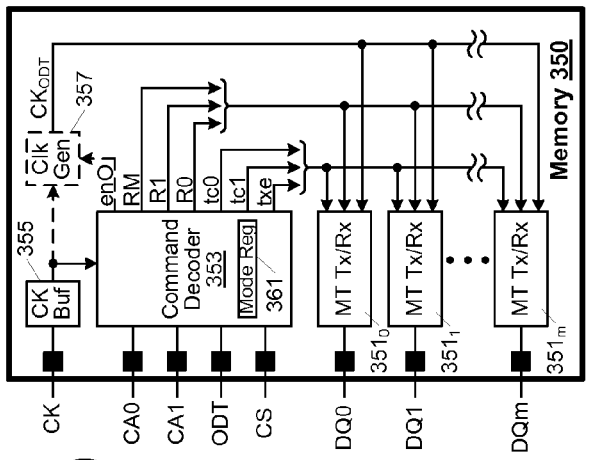
FIG. 9 illustrates an embodiment of a memory component having multiple modulated-termination transceivers.

FIG. 9 illustrates an embodiment of a memory component 350 having multiple modulated-termination transceivers $351_0$-$351_m$, as well as a command decoder 353, clock buffer 355 and optional termination clock generator 357. Command decoder 353 receives a number of command/address signals (e.g., from a two-bit command address path, CA0 and CA1, in this example, though more or fewer C/A inputs may be provided), and also receives an ODT signal and chip-select (CS) signal. In the implementation shown, command decoder 353 generates a transmit-enable signal, txe, and encoded termination control signals, tc1 and tc0, as described in reference to FIG. 7A (e.g., with the termination control signal states being encoded as shown in table 280), outputting those signals to the modulated-termination transceivers $301_0$-$301_m$ in common. The modulated-termination transceivers themselves may be implemented generally as described in reference to FIGS. 7A-7C and 8 and thus apply either fixed or modulated termination (or no termination) in accordance with the termination control signals.

Still referring to FIG. 9, the command decoder also includes one or more programmable mode registers 361 that may be programmed with termination values R0, R1 and RM. The termination values are output to the modulated-termination transceivers $301_0$-$301_m$ as shown and applied by respective termination/driver networks therein to establish the fixed and modulated termination impedances described above. Though not shown, the command decoder (or other circuitry within the memory component) may also supply calibration signals to the transceivers to enable selected termination loads to be calibrated, for example, to an internal or external reference.

As mentioned, memory component 350 may include an on-chip termination clock generator 357 to generate an ODT clock, outputting the ODT clock to the modulated-termination transceivers $301_0$-$301_m$ as shown. Termination clock generator 357 may be a free-running voltage-controlled oscillator (e.g., a ring oscillator or tank (LC) oscillator) designed and/or tuned to oscillate at an approximate frequency (e.g., at a frequency equal to the bit rate, twice the bit rate or any other frequency that sufficiently up-converts reflected signals, including frequencies that are not integer multiples of the bit rate), or may be a clock multiplier (e.g., a phase-locked loop, multiplying delay-locked loop, multiplying injection locked oscillator, etc.) that generates the termination clock at a frequency multiple of a clock signal supplied from an external source (i.e., received by the clock buffer 355). In the embodiment shown, a single termination clock generator 357 supplies the ODT clock to all transceivers (i.e., to all data slices), though multiple clock generators may be provided to deliver respective ODT clocks (which may but need not be frequency and/or phase aligned with one another) to individual transceivers or groups of transceivers. Note also that the ODT clock frequency and/or phase need not be the same in all integrated circuit components coupled to a given signaling link, though the phase and/or frequency relationship between such clocks may be controlled to improve performance. In another embodiment, the on-chip clock generator may be omitted and an externally supplied clock signal received via clock buffer 355, for example, may be supplied, as the termination clock, to modulated-termination transceivers $301_0$-$301_m$. In embodiments having an on-chip termination clock generator 357, the command decoder may assert an oscillator-enable signal, "enO," during modulated-termination intervals and then deassert the oscillator-enable signal to disable the clock generator (and thus limit power consumption therein) during intervals in which fixed or no termination is indicated or in applications or under conditions in which the modulated-termination feature is disabled.

Figure 10:
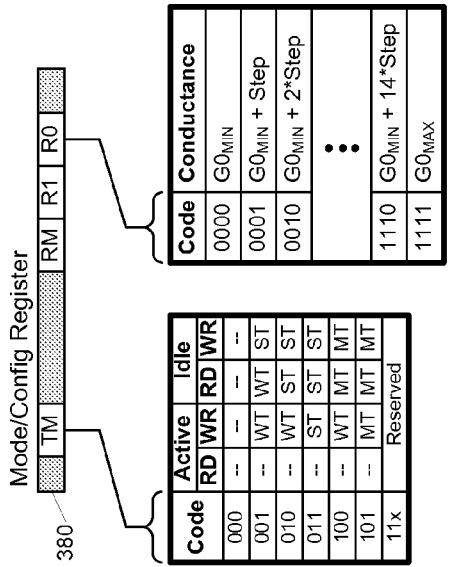
FIG. 10 illustrates an embodiment of a mode register that may be used to implement the mode register shown within the command decoder of FIG. 9.

FIG. 10 illustrates an embodiment of a mode register 380 that may be used to implement the mode register shown within the command decoder of FIG. 9. In the implementation shown, a single mode register includes a termination-mode field ("TM") and termination impedance fields, ("R0," "R1" and "RM"), as well as other fields (not shown) that may be used to configure and control memory component operation. In alternative embodiments, the various fields may be distributed between/among two or more mode registers and there may be additional termination impedance fields to provide additional fixed and/or modulated termination selections. The fields themselves may be encoded in various ways. In the example shown, for instance, the termination-mode field stores a three-bit code that can be used to specify one of multiple different termination schemes, including a termination-disabled mode ('000' in this example) in which termination is disabled (i.e., no termination applied as indicated by '--') regardless of whether the memory component is an active or idle component within a read or write operation. In other modes, various combinations of weak termination (e.g., applying R0), strong termination (e.g., applying R1) and modulated termination (alternately applying R1 and R2) may be applied according to the conditions detected in response to incoming signals. In termination mode '100', for example, the subject memory component applies weak termination ("WT") when selected to receive write data (i.e., active component during write operation), and applies modulated termination ("MT") when a spectator to read or write data transmission (i.e., idle component during read operation or write operation). By contrast, in termination mode '101,' the memory component applies modulated termination during all transactions in which it is not required to actively output read data (i.e., applying modulated termination when active during a write operation, or when idle during a read or write operation). More generally, any beneficial combination of weak, strong and modulated terminations may be applied under specified conditions. Also, additional bits may be provided within the termination mode field in other embodiments, for example, to support various policies or conditions under which modulated termination is to be enabled (e.g., modulated termination disabled if system operating under battery power, and enabled if operating under line power).

Still referring to FIG. 10, each of the termination impedance fields (R0, R1 and RM in the example shown) may be implemented by more or fewer than the four bits shown. Also, in one embodiment, each of the termination impedance fields may be programmed to specify one of a number of termination impedances ranging from $1/G_{MIN}$ to $1/G_{MAX}$ in uniform conductance steps (i.e., $1/(G_{MIN}+i*Step)$ where 'i' is the programmed value, "Step" is the incremental conductance added to lower the termination impedance, and '*' denotes multiplication). In alternative embodiments, other algorithmic or heuristic applications of the programmed termination impedance value may determine the applied termination impedance. Also, the different programmed termination impedance values may correspond directly to specific termination loads and thus effect an indexed rather than algorithmic application of the programmed termination values.

Figure 11:
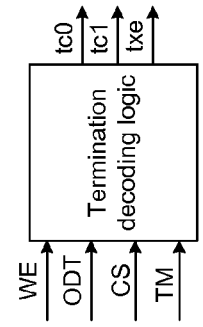
FIG. 11 illustrates an embodiment of a termination decoding logic circuit that may be provided within the command decoder of FIG. 9 to generate termination control signals in response to externally supplied control signals.

FIG. 11 illustrates an embodiment of a termination decoding logic circuit 385 that may be provided within the command decoder of FIG. 9 to generate termination control signals in response to externally supplied control signals. In the example shown, the termination decoding logic circuit receives ODT, chip-select (CS) and write-enable (WE) signals (the latter being provided, for example, as part of an incoming command) which indicate, for a given memory transaction, (i) whether on-die termination is to be applied, (ii) whether the subject memory component is an active participant or a spectator to the data transfer (i.e., active or idle component) and (iii) whether the transaction is a memory read or write operation. In embodiments in which no distinction is made between idle mode write and read termination (i.e., same type and strength of termination applied in either case), the write-enable signal may be omitted. The termination decoding logic also receives a termination mode value from a mode register or configuration register with the termination mode bits being encoded, for example, as shown in FIG. 10. By this operation, the termination decoding logic may generate termination control and transmit-enable signals (tc[1:0] and txe) in accordance with the termination mode specified by the termination mode value and the role of the memory component within a given memory transaction as indicated by the ODT, CS and WE signals.

Figure 12:
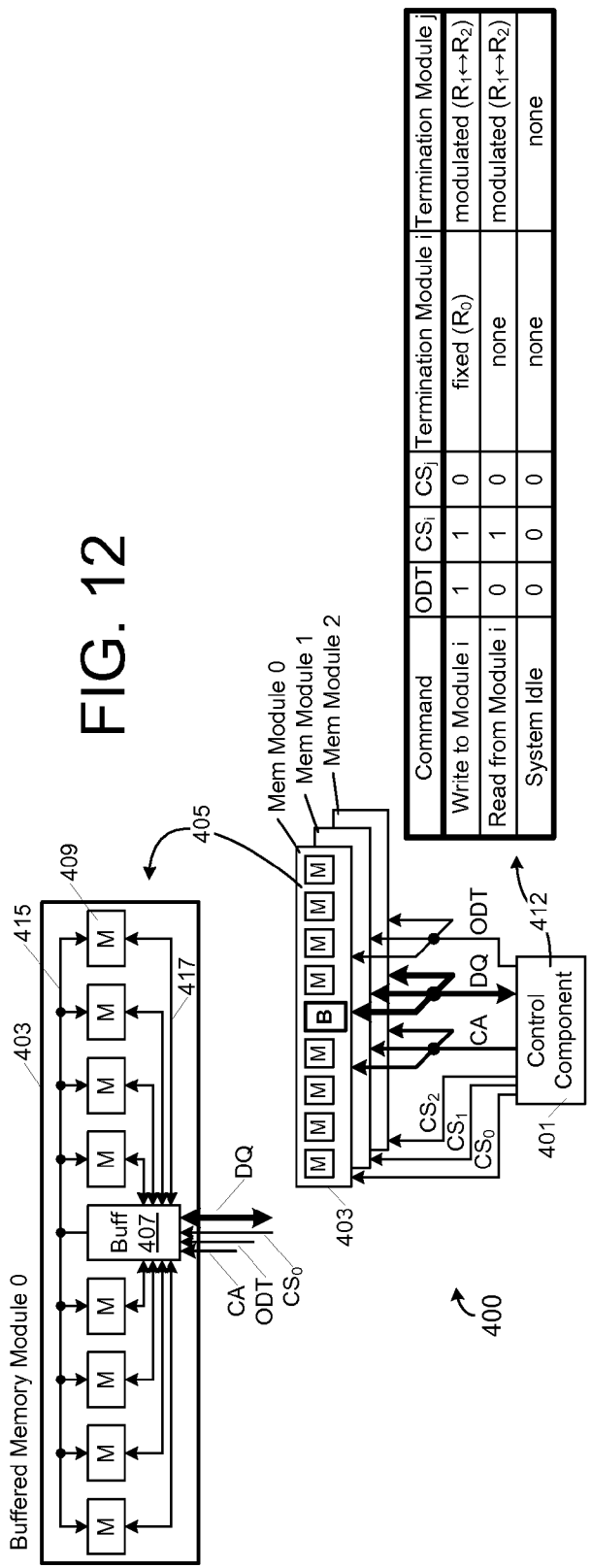
FIG. 12 illustrates an alternative embodiment of a memory system having memory modules in which modulated termination is effected within a buffer integrated circuit instead of or in addition to individual memory devices attached to the buffer integrated circuit.

FIG. 12 illustrates an alternative embodiment of a memory system 400 having memory modules 403 in which modulated termination is effected within a buffer IC instead of or in addition to individual memory devices attached thereto. Referring to detail view 405 of a memory module 403, the buffer IC 407 is coupled to module data links, command/address links, ODT and chip-select lines in generally the same manner as memory devices in the embodiments described above, and applies fixed or modulated termination (or no termination) to the data links according to the table shown at 412 (or according to the various termination control arrangements described, for example, with respect to FIGS. 4-6). In one embodiment, a single buffer device 407 is coupled to the memory devices 409 of two or more ranks (e.g., coupled to memory ranks disposed on opposite faces of the module substrate), delivering command/address to all attached memory devices via a common memory command/address link 415 and exchanging data with the attached memory devices via respective data links 417. In such an embodiment, the incoming chip-select signal (e.g., $CS_0$ as shown in detail view 405) may include multiple component signals, one for each rank of memory devices to be exclusively selected, and/or snooping logic may be provided within the buffer IC 407 to enable command/address based distinction between different memory ranks. In another embodiment, a separate buffer IC 407 is provided for each rank of memory devices and coupled in parallel with one or more other buffer ICs to the controller-connected command/address, data and ODT signaling lines and coupled to receive a dedicated chip-select signal. Again, snooping logic may be provided within buffer IC 407 to enable command/address-based distinction between different memory ranks, thus obviating a dedicated chip-select signal per link. Also, while the memory module depicted in FIG. 12 and other figures above is formed by a printed circuit board substrate having packaged or bare-die memory ICs disposed thereon (e.g., memory ICs disposed on both faces as in a DIMM, or on only a single face as in a single inline memory module (SIMM)), other multi-chip arrangements may be used to implement the memory module in all such cases including, for example and without limitation, multi-chip modules (e.g., multiple die disposed side by side and/or stacked on one another and encapsulated within a package housing), three-dimensional IC, package-in-package, package-on-package and so forth.

Figure 13:
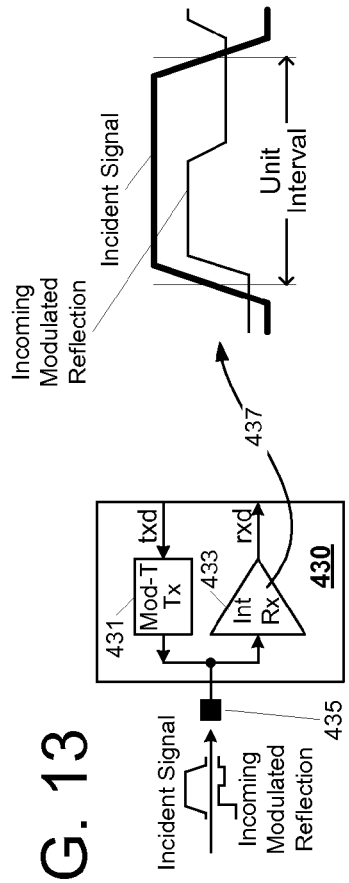
FIG. 13 illustrates an alternative embodiment of a modulated-termination transceiver that may be used within the various integrated circuit devices discussed herein to provide on-demand modulated termination.

FIG. 13 illustrates an alternative embodiment of a modulated-termination transceiver 430 that may be used within the various integrated circuit devices discussed above to provide on-demand modulated termination. As shown, transceiver 430 includes a modulated-termination transmitter 431 that operates generally as discussed above (e.g., circuit that may be used alternatively to transmit a signal via signal I/O node 435 or apply a fixed or modulated termination to the I/O node) and also includes an integrating receiver 433. That is, instead of sampling an incoming signal at an instant in response to a timing signal transition, integrating receiver 433 integrates the signal level over a unit interval as shown at 437 (i.e., a transmit or receive interval allocated to conveyance of a single symbol over a signaling link coupled to I/O node 435) or over a fraction of a unit interval. At the conclusion of the unit interval, comparator circuitry within integrating receiver 433 compares the integrated result to a decision threshold to resolve a logic '1' or logic '0' sample. This approach tends to be particularly beneficial when used in combination with modulated termination, as integration has an averaging (or low-pass filtering) effect. Therefore, the residual portion of the reflection resulting from the modulated termination (i.e., the portion of the reflection not lost in the channel) gets further attenuated as it is filtered by the integrator.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within an integrated circuit device, the method comprising:
   coupling a first termination impedance to a signaling link during a first portion of a bit time interval in which a data bit is conveyed via the signaling link; and
   coupling a second termination impedance to the signaling link during a second portion of the bit time interval, the second termination impedance being different from the first termination impedance.

2. The method of claim 1 wherein one of the first and second termination impedances is greater than an impedance of the signaling link and the other of the first and second termination impedances is less than the impedance of the signaling link.

3. The method of claim 1 wherein coupling the first termination impedance to the signaling link and coupling the second termination impedance to the signaling link comprises cyclically coupling the first termination impedance and the second termination impedance to the signaling link in response to an oscillating signal, coupling the first termination impedance to the signaling link when the oscillating signal is in a first state and coupling the second termination impedance to the signaling link when the oscillating signal is in a second state.

4. The method of claim 3 wherein the data bit is one bit of a sequence of bits conveyed via the signaling link in respective bit time intervals, and wherein the oscillating signal cycles at least once per bit interval.

5. The method of claim 1 wherein the data bit is a data bit conveyed between two other integrated circuit devices coupled to the signaling link.

6. The method of claim 5 wherein the integrated circuit device is a first memory device, the first of the two other integrated circuit devices comprises a memory controller and the second of the two other integrated circuit devices comprises a second memory device, and wherein the data bit is either a write data bit transmitted by the memory controller to the second memory device or a read data bit transmitted by the second memory device to the memory controller.

7. The method of claim 1 wherein coupling the first termination impedance to the signaling link comprises switchably coupling a first termination load between an input node of the integrated circuit device and a first supply voltage node, and wherein coupling the second termination impedance to the signaling link comprises switchably coupling a second termination load between the input node and the first supply voltage node.

8. The method of claim 7 wherein switchably coupling the second termination load between the input node and the first supply voltage node comprises switchably coupling the second termination load between the input node and the first supply voltage node in parallel with the first termination load.

9. The method of claim 7 wherein switchably coupling the first termination load between the input node and the first supply voltage node comprises switchably coupling a first plurality of termination elements between the input node and the first supply voltage node and wherein switchably coupling the second termination load between the input node and the first supply voltage node comprises switchably coupling a second plurality of termination elements between the input node and the first supply voltage node.

10. The method of claim 9 wherein the second plurality of termination elements comprises termination elements that are included within the first plurality of termination elements.

11. An integrated circuit device comprising:
an input node to be coupled to a signaling link; and
termination circuitry to couple a first termination impedance to the input node during a first portion of a bit time interval in which a data bit is conveyed via the signaling link and to couple a second termination impedance to the input node during a second portion of the bit time interval the second termination impedance being different from the first termination impedance.

12. The integrated circuit device of claim 11 wherein one of the first and second termination impedances is greater than an impedance of the signaling link and the other of the first and second termination impedances is less than the impedance of the signaling link.

13. The integrated circuit device of claim 11 wherein the termination circuitry comprises circuitry to cyclically couple the first termination impedance and the second termination impedance to the signaling link in response to an oscillating signal, including circuitry to couple the first termination impedance to the signaling link when the oscillating signal is in a first state and to couple the second termination impedance to the signaling link when the oscillating signal is in the second state.

14. The integrated circuit device of claim 11 wherein the data bit is a data bit conveyed between two other integrated circuit devices coupled to the signaling link.

15. The integrated circuit device of claim 14 wherein the integrated circuit device is a first memory device, the first of the two other integrated circuit devices comprises a memory controller and the second of the two other integrated circuit devices comprises a second memory device, and wherein the data bit is either a write data bit transmitted by the memory controller to the second memory device or a read data bit transmitted by the second memory device to the memory controller.

16. The integrated circuit device of claim 11 wherein the termination circuitry to couple the first termination impedance to the input node comprises one or more switching elements to switchably couple a first termination load between the input node and a first supply voltage node and wherein the termination circuitry to couple the second termination impedance to the input node comprises one or more switching elements to switchably couple a second termination load between the input node and the first supply voltage node.

17. The integrated circuit device of claim 16 wherein the one or more switching elements to couple the second termination load between the input node and the first supply voltage node comprises one or more transistor switches to couple the second termination load between the input node and the first supply voltage node in parallel with the first termination load.

18. The integrated circuit device of claim 16 wherein the one or more switching elements to couple the first termination load between the input node and the first supply voltage node comprise a first plurality of switching elements to couple a first plurality of termination elements between the input node and the first supply voltage node and wherein the one or more switching elements to couple the second termination load between the input node and the first supply voltage node comprises a second plurality of switching elements to couple a second plurality of termination elements between the input node and the first supply voltage node.

19. The integrated circuit device of claim 18 wherein the second plurality of termination elements comprises termination elements that are included within the first plurality of termination elements and wherein the second plurality of switching elements comprises switching elements that are included within the first plurality of switching elements.

20. A non-transitory machine readable medium that stores data representative of an integrated circuit device comprising:
an input node to be coupled to a signaling link; and
termination circuitry to couple a first termination impedance to the input node during a first portion of a bit time interval in which a data bit is conveyed via the signaling link and to couple a second termination impedance to the input node during a second portion of the bit time interval the second termination impedance being different from the first termination impedance.

* * * * *